United States Patent
Nistler

(10) Patent No.: US 7,012,431 B2
(45) Date of Patent: Mar. 14, 2006

(54) RADIO-FREQUENCY ANTENNA FOR A MAGNETIC RESONANCE SYSTEM

(75) Inventor: Jürgen Nistler, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/782,263

(22) Filed: Feb. 19, 2004

(65) Prior Publication Data

US 2004/0227515 A1 Nov. 18, 2004

(30) Foreign Application Priority Data

Feb. 19, 2003 (DE) ................................ 103 06 998

(51) Int. Cl.
*G01V 3/00* (2006.01)
(52) U.S. Cl. ..................... 324/318; 324/319
(58) Field of Classification Search ............... 324/318, 324/319, 322, 320, 300, 307, 309; 600/421, 600/410
See application file for complete search history.

(56) References Cited

U.S. PATENT DOCUMENTS

| | | |
|---|---|---|
| 4,736,161 A | 4/1988 | Prevot et al. |
| 6,060,883 A | 5/2000 | Knüttel |
| 6,100,691 A * | 8/2000 | Yeung .................... 324/318 |
| 6,344,745 B1 * | 2/2002 | Reisker et al. ............ 324/318 |
| 6,781,378 B1 * | 8/2004 | Eberler et al. ............ 324/318 |
| 2002/0011843 A1 | 1/2002 | Harvey |
| 2003/0178997 A1 | 9/2003 | Eberler et al. |

FOREIGN PATENT DOCUMENTS

| | | |
|---|---|---|
| DE | OS 100 52 192 | 5/2000 |
| EP | 0 758 091 | 2/1997 |
| JP | 11329367 | 5/2001 |

OTHER PUBLICATIONS

"Fast Drop Off Cylindrical RF Transmit Coils," Boskamp, Proc Intl. Soc. Mag. Reson. Med., vol. 10 (2002).

* cited by examiner

*Primary Examiner*—Brij B. Shrivastav
(74) *Attorney, Agent, or Firm*—Schiff Hardin LLP

(57) ABSTRACT

A radio-frequency antenna for a magnetic resonance system has a number of antenna rods and two rings. The antenna rods are regularly arranged around an antenna axis and are each connected at their rod ends with one of the rings per rod end. When the antenna rods proceed substantially parallel to the antenna axis, they exhibit, in a middle region of the antenna axis, a rod spacing from the antenna axis that is larger than the ring spacing from the antenna axis for at least one of the ferules. Either the antenna rods, with regard to their total length, are bent radially inwardly only in the area of the last 10%, or they proceed radially inwardly from their middle region over at least 20%, whereby in the outermost 10% no inward change ensues, or the rings, in their connection regions, are directed radially outwardly toward the antenna rods. Alternatively the antenna rods, together with the antenna axis, form an inclination angle, and exhibit, at their rod end situated farther from the antenna axis, a rod spacing from the antenna axis that is larger than a ring spacing from the antenna axis for the ring that is connected with the rod end situated farther from the antenna axis.

70 Claims, 7 Drawing Sheets

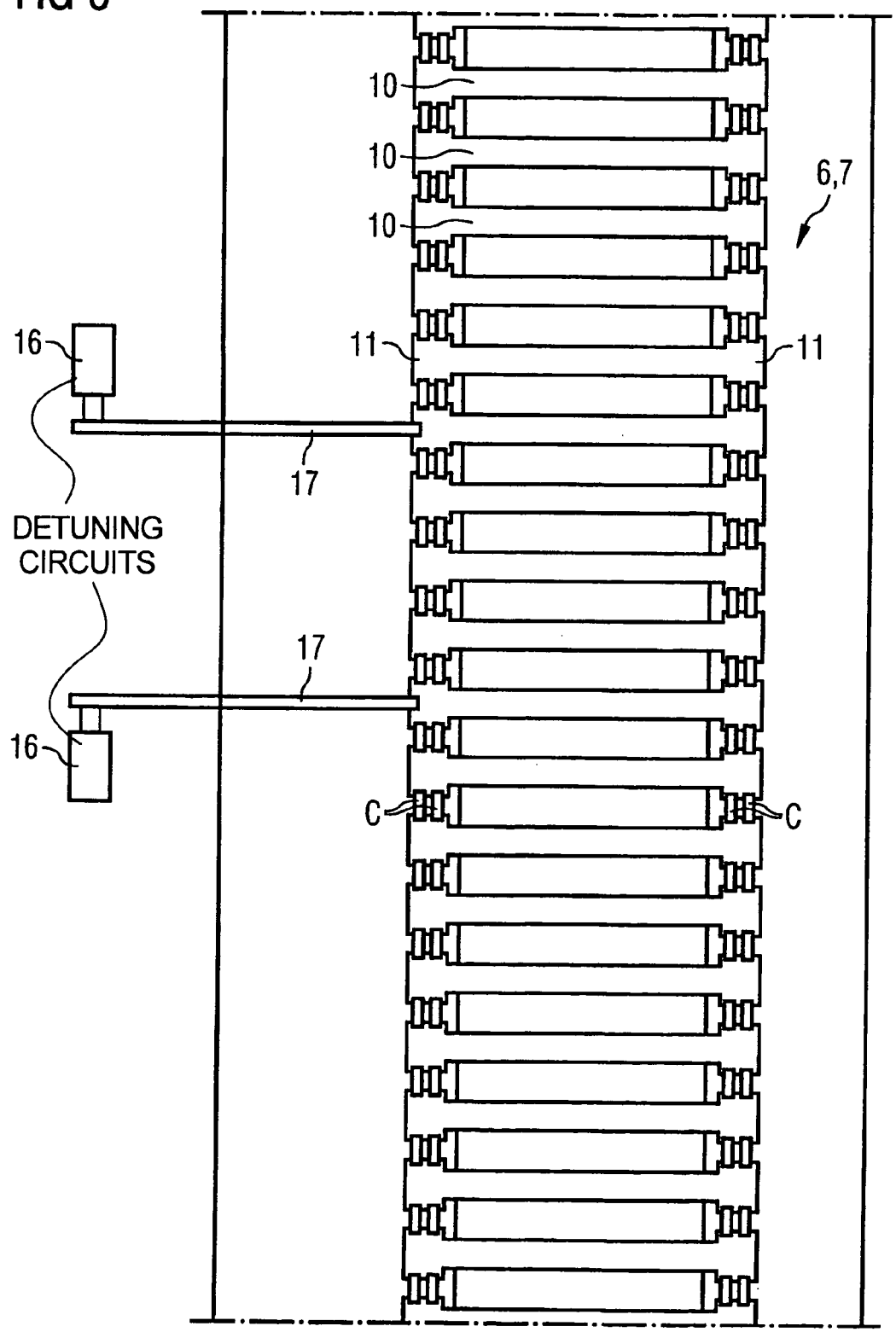

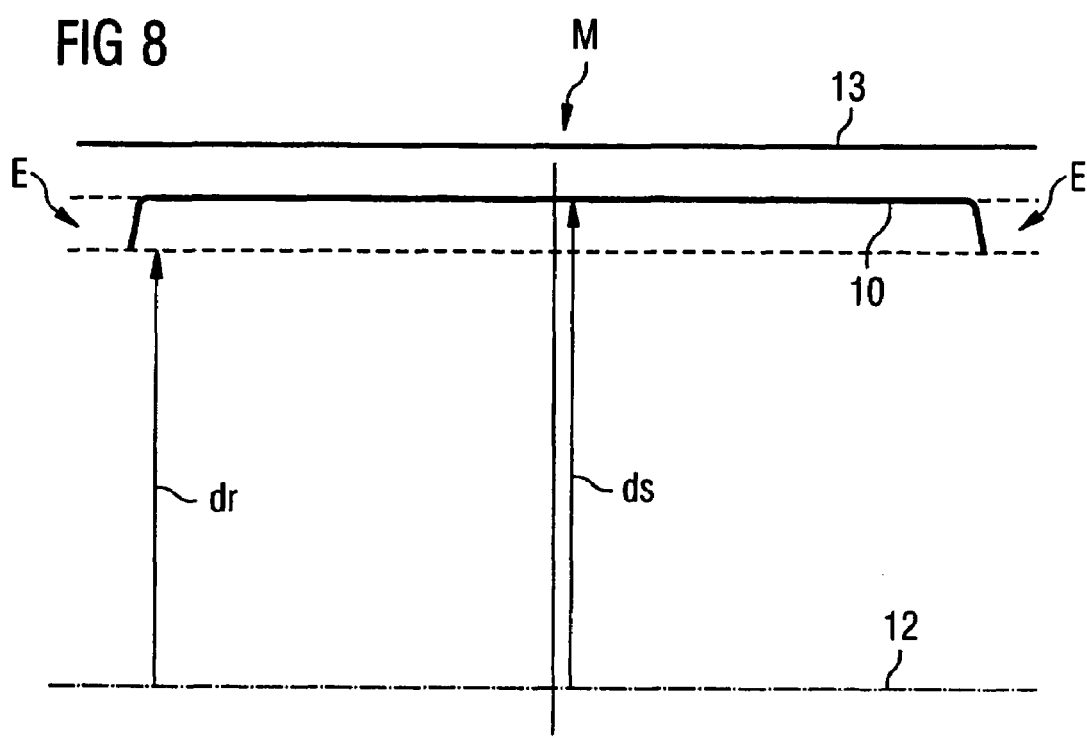
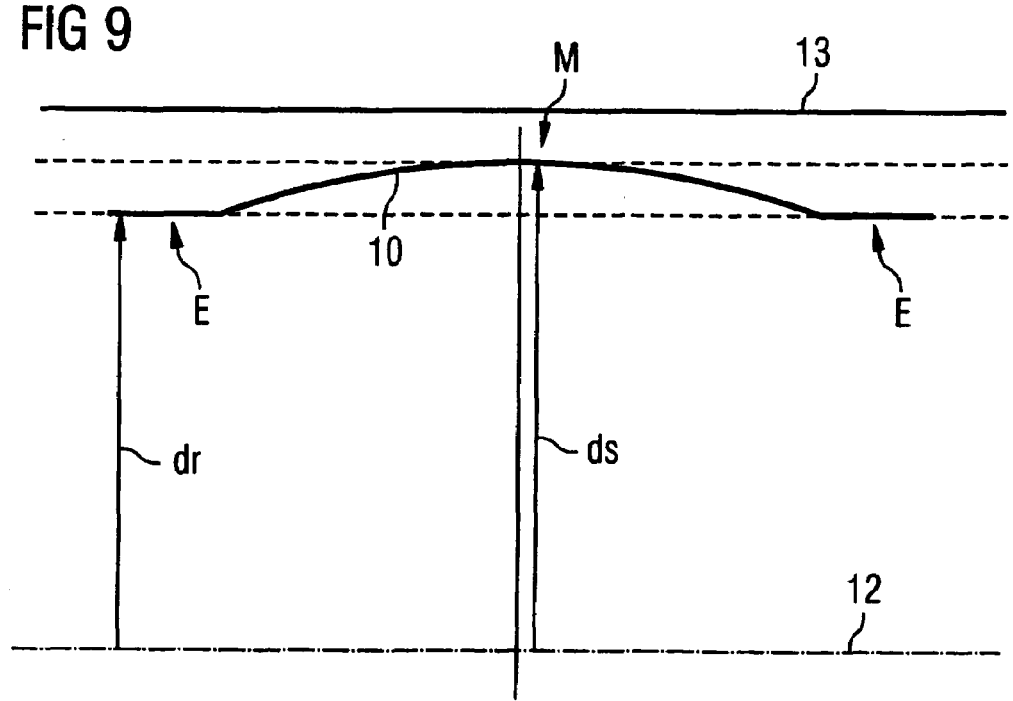

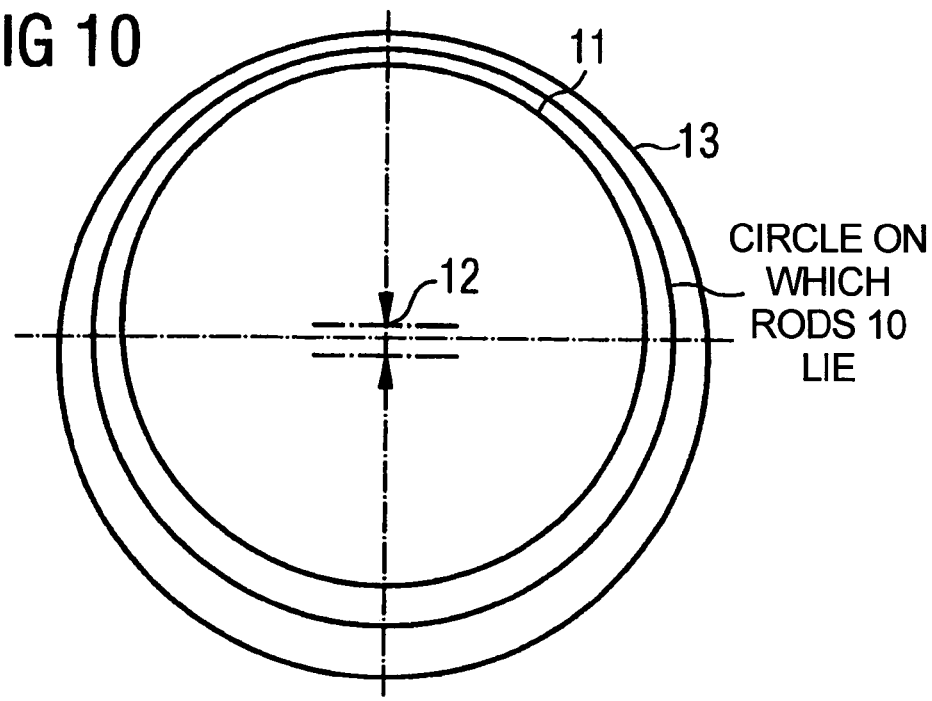
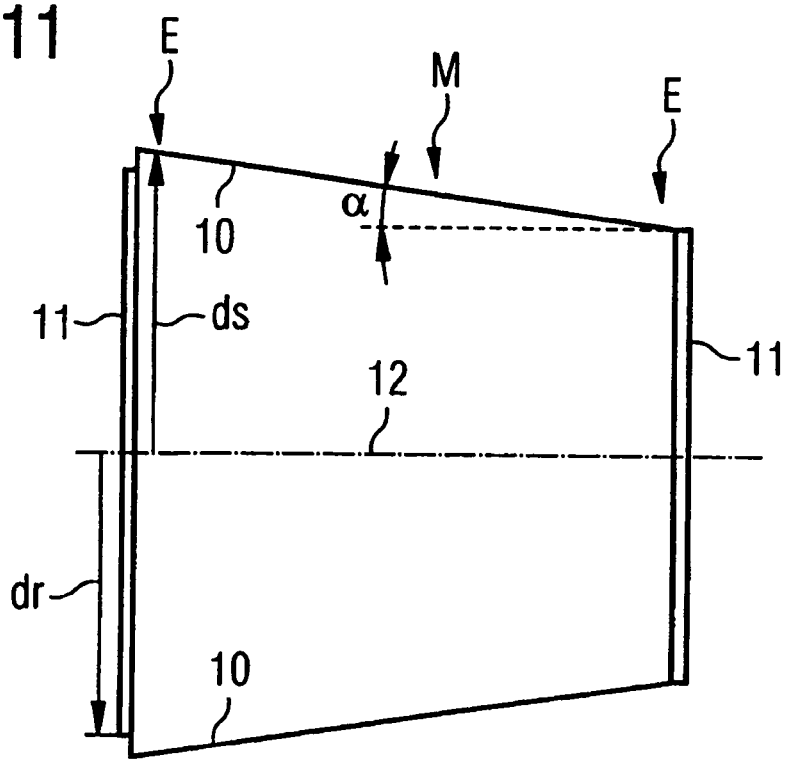

RADIO-FREQUENCY ANTENNA FOR A MAGNETIC RESONANCE SYSTEM

BACKGROUND OF THE INVENTION

1. Field of the Invention

The present invention concerns a radio-frequency antenna for a magnetic resonance system of the type having a number of antenna rods and two rings, with the antenna rods disposed regularly around an antenna axis and each connected at their respective rod ends with one of the rings and wherein either each antenna rod proceeds substantially parallel to the antenna axis and exhibits a rod spacing in a middle region of the antenna axis, or each antenna rod forms with the antenna axis an inclination angle, such that the radio-frequency antenna is in the shape of a frustrum and, at its rod end situated farther from the antenna axis, exhibits a rod spacing from the antenna axis.

2. Description of the Prior Art

Radio-frequency antennas of the above type are—in particular in the case of the antenna rods being parallel to the antenna axis—generally known as birdcage resonators. Capacitors are arranged in the rings and/or the antenna rods. The radio-frequency antenna is adjusted so that, for a predetermined or predeterminable operating frequency of the radio-frequency antenna, it forms a resonant oscillating circuit.

Birdcage resonators are known from German PS 197 32 783 and Patent Abstracts of Japan for JP-A-2000 166 895, in which the rings are farther from the antenna axis than the antenna rods.

Nuclear spins of an examination subject (often a person) are excited to resonance by magnetic fields emitted by such radio-frequency antenna. The resonances are then acquired and evaluated. The acquisition of the resonance signals can ensue with the same antenna.

Due to the trend toward ever-shorter magnet systems, the risk exists in conventional whole-body transmitting antennas that are image artifact known as the ambiguity artifact will occur. Ambiguity artifacts are caused by, due to the superimposition of basic magnetic field and gradient magnetic field, two or more locations existing at which the same total field strength predominates. Typically, one of these locations is situated within a desired acquisition volume, and at least one further location is situated outside of the acquisition volume. If the radio-frequency field strength at the location outside of the acquisition volume is of a sufficient volume, it leads to the superimposition of the image information from both locations in the image reconstruction.

To prevent the ambiguity artifact, it must be insured that the radio-frequency magnetic field outside of the acquisition volume decreases sufficiently rapidly. It must simultaneously be insured for that the radio-frequency signal is sufficiently homogenous within the acquisition volume.

Whole-body transmitting antennas normally are fashioned as birdcage resonators. Due to this design, these antennas already possess a rapid field drop off in the lengthwise (longitudinal) axis, however, severe limitations in the field homogeneity arise in the case of very short magnets and/or very short antennas.

From the scientific essay "Fast drop off cylindrical Radio-frequency transmit coils", by E. B. Boskamp, appearing in the Proceedings of the ISMRM volume 10 (2002), a combination of a number of birdcage resonators is specified that are connected with one another such that a suitable field profile can be generated.

A radio-frequency antenna for a magnetic resonance system is known from U.S. Pat. No. 6,344,745 that has a number of antenna rods and two rings. In this radio-frequency antenna, the antenna rods are regularly arranged around an antenna axis and are connected at their rod ends with one of the rings per rod end. Each antenna rod is substantially parallel to the antenna axis and exhibits in a middle region a rod spacing from the antenna axis that is larger than a ring spacing from the antenna axis for at least one of the rings in the region of this antenna rod. In this radio-frequency antenna, the antenna rods gradually proceeds radially inwardly over an area that amounts to at least 37.5% of the total length of the antenna rods. In this area, the antenna rods are curved radially inwardly in the shape of a circular arc. This area extends to the end of the respective antenna rod.

A radio-frequency antenna for a magnetic resonance system is known from German OS 100 52 192 that has a number of antenna rods and two rings. In this radio-frequency antenna, the antenna rods also are regularly arranged around an antenna axis and also are connected at their rod ends with one of the rings per rod end. The antenna rods also are substantially parallel to the antenna axis and exhibit in a middle region a rod spacing from the antenna axis that is larger than a ring spacing from the antenna axis for at least one of the rings in the region of this antenna rod. This is achieved by the antenna rods being curved over their entire length, such that the radio-frequency antenna has a barrel-like appearance.

Various radio-frequency antennas for a magnetic resonance system are known from Japanese Application 2001 145 608. In these radio-frequency antennas, a number of antenna rods are regularly arranged around an antenna axis. The antenna rods are connected at their rod ends with rings. In one of these radio-frequency antennas, the antenna rods, relative to the antenna axis, form an inclination angle, such that the radio-frequency antenna is fashioned in the shape of a frustrum. At the rod ends situated farther from the antenna axis, the antenna rods exhibit a rod spacing from the antenna axis. At this location, the ring appears to exhibit the same spacing from the antenna axis as the respective antenna rod.

A radio-frequency antenna for a magnetic resonance system is known from U.S. Pat. No. 4,736,161 that has a number of antenna rods and two rings. In this radio-frequency antenna, exactly two detuning circuits are present by means of which the radio-frequency antenna can be detuned. The detuning circuits are connected to supply cables for the radio-frequency antenna. A similar arrangement is described in European Application 0 758 091.

A radio-frequency antenna for a magnetic resonance system is known from U.S. Patent Application Publication No. 2002/0011843 that has a number of antenna rods and two rings, wherein the antenna rods form two substructures twisted opposite one another, each of the substructures being regularly arranged around the antenna axis, and the substructures exhibiting rod spacings differing from one another. The substructures are thereby arranged in a circular fashion around the antenna axis.

SUMMARY OF THE INVENTION

An object of the present invention is to provide a radio-frequency antenna suitable for magnetic resonance systems, with which a faster outward field drop-off can be achieved in a simple manner.

The above object is achieved in a radio-frequency antenna of the initially cited type having antenna rods parallel to the antenna axis, wherein the rod spacing from the antenna axis is larger than a ring spacing from the antenna axis for at least one of the rings in the region of this antenna rod, and wherein this is accomplished by either the antenna rods, with regard to their total length, being bent radially inwardly only in the area of the longitudinally outermost 10%, or the antenna rods, with regard to their total length, proceed radially inwardly from their middle region over at least 20%, and in the longitudinally outermost 10% do not exhibit radially inward charge, or the rings, at regions at which the rods are connected, are directed radially outwardly towards the antenna rods.

The above object also is achieved in a radio-frequency antenna of the initially cited type having an inclination angle between the antenna rods and the antenna axis, wherein the rod spacing from the antenna axis is larger than a ring spacing from the antenna axis for at least one of the rings in the region of this antenna rod, by means of the rod end of this antenna rod being situated farther from the antenna axis than the ring.

The connection of the antenna rods with the ring can in this case in particular be effected by the antenna rods being directed radially inwardly at the appertaining rod end. Alternatively, it is possible for the connection of the antenna rods with the one ring or the rings to be effected by the appertaining ring being directed radially outwardly to the antenna rods in its connection region.

The inventive effect is stronger the smaller that the ring spacing is compared than the rod spacing. The difference between the ring spacing and the rod spacing should be at least 5 mm (preferably 10 to 15 mm).

The antenna rods and the rings preferably are radially outwardly surrounded by a radio-frequency shielding.

As a rule, the radio-frequency shielding has in the region of the antenna rod in question, a shielding spacing from the antenna axis. A particularly good effect results from the reduction of the ring spacing when the difference between the ring spacing and the rod spacing is at least 15% (preferably 20% to 40%) of the difference between the shielding spacing and the rod spacing.

The radio-frequency shielding optionally can be arranged symmetrically or asymmetrically with regard to the antenna axis.

By reducing the spacing of the appertaining ring to the antenna axis compared to that of the antenna rods, the outlay for detuning the radio-frequency antenna also can be reduced. It is in particular sufficient when the radio-frequency antenna has exactly two detuning circuits with which the radio-frequency antenna can be detuned.

Conventionally, the detuning circuits are installed in the radio-frequency antenna itself, in particular they are arranged in the connection regions of the rings with the antenna rods. In contrast, in the inventive radio-frequency antenna it is possible for the detuning circuits to be connected to supply cables for the radio-frequency antenna.

When the radio-frequency antenna is externally installed on a carrier tube, the designed arrangement of the individual components of the radio-frequency antenna can be realized in a particularly simple manner.

The inventive radio-frequency antenna can be fashioned as a local antenna or as a whole-body antenna. In particular in the lafter case, the rod spacing is typically between 25 and 35 cm.

In an even further optimized embodiment, the antenna rods can form at least two substructures that are circumferentially rotated (offset) relative to one another, with each of the substructures being regularly arranged around the antenna axis and the substructures exhibiting rod spacings differing from one another. The antenna rods or the substructures are as a rule arranged circularly around the antenna axis, however, they can also be arranged elliptically around the antenna axis.

The rings are as a rule arranged symmetrically with regard to the antenna axis, however, they can also be arranged asymmetrically with regard to the antenna axis.

DESCRIPTION OF THE DRAWINGS

FIG. 5 shows the radio-frequency antenna of FIG. 2 in unrolled representation.

FIG. 8 is a side schematic view of a first embodiment of an antenna rod in a radio-frequency antenna in accordance with the invention.

FIG. 9 is a side schematic view of a second embodiment of an antenna rod in a radio-frequency antenna in accordance with the invention.

FIG. 10 is a plan view of a further embodiment of a radio-frequency antenna in accordance with the invention.

FIG. 11 is a side view of a radio-frequency antenna in accordance with the invention, in a frustrum embodiment.

DESCRIPTION OF THE PREFERRED EMBODIMENTS

Figure 1:
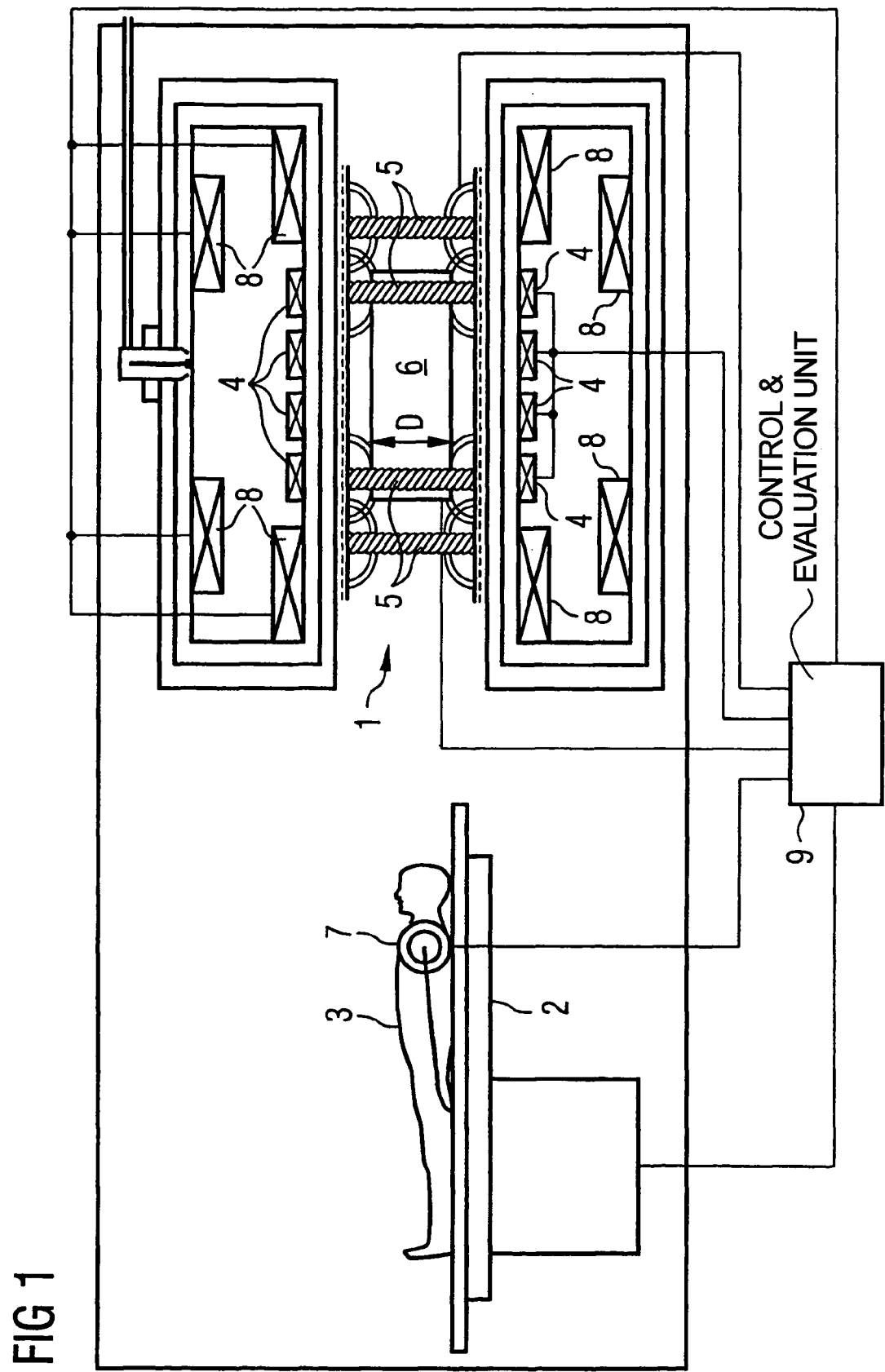
FIG. 1 schematically illustrates the basic components of a magnetic resonance system in which the inventive radio-frequency antenna can be used.

As shown in FIG. 1, a magnetic resonance system has an examination space 1. A patient 3 (in general: an examination subject 3) can be inserted into the examination space 1 by means of a patient bed 2. The examination space normally is substantially cylindrically and exhibits an inner diameter D.

The examination space 1 is surrounded by various magnets and magnet systems. The first is a basic field magnet 4. The basic field magnet 4 serves to generate a homogenous basic magnetic field. A gradient magnet system 5 is also present. Gradient fields are generated by means of the gradient magnet system 5 that are necessary for the generation of meaningful, evaluable magnetic resonance signals. The magnet system also has a whole-body coil 6. The whole-body coil 6 is fashioned as a radio-frequency antenna. In operation, it serves as a transmitting antenna to excite magnetic resonance signals in the examination subject 3. In operation as a receiving antenna, it serves to receive the excited magnetic resonance signals of the examination subject 3.

At least one local coil 7 normally can be inserted inside the examination space 1. It is likewise fashioned as a radio-frequency antenna. It normally serves for local reception of magnetic resonance signals that have been previously excited by means of the whole-body coil 6, however, in the individual case the local coil 7, like the whole-body coil 6, also can be operated as a transmitting antenna. The design of the local coil 7 can—except for correspondingly smaller dimensions—be similar to the design of the whole-body coil 6.

The basic field magnet 4, the gradient field magnet system 5 and the coils 6, 7 are surrounded by a shielding magnet 8.

The gradient magnet system 5 and the coils 6, 7 are connected to a control and evaluation unit 9 for suitable control of the gradient magnet system 5 and of the coils 6, 7 in a known manner to excite, to receive and to evaluate magnetic resonance signals.

Figure 2:
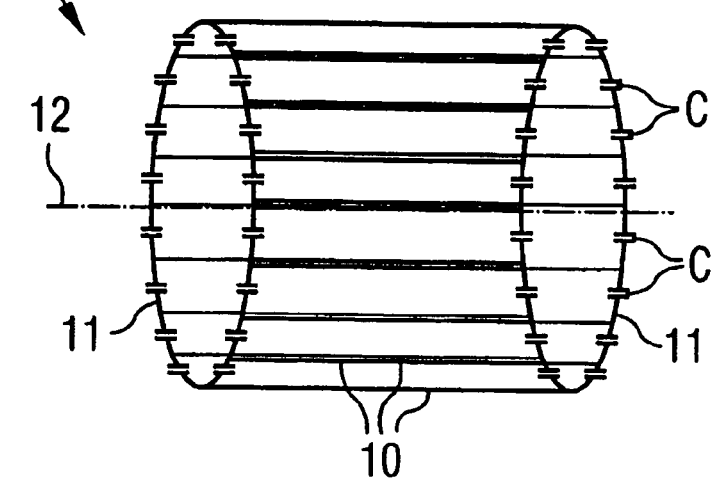
FIG. 2 shows a known radio-frequency antenna in a perspective view.

As shown in FIG. 2, a conventional radio-frequency antenna 6, 7—be it in the form of the whole-body coil 6, be it in the form of the local coil 7—has a number of antenna rods 10 as well as two rings 11. Also arranged in the antenna rods 10 and/or the rings 11 are capacitors C by means of which the radio-frequency antenna 6, 7 is tuned to a specific operating frequency. These capacitors C are arranged in the rings 11 according to FIG. 2. The rings 11 thus have ring segments, however, this is of secondary importance in the framework of the present invention.

The antenna rods 10 in the embodiment according to FIG. 2 are parallel to an antenna axis 12. They are arranged at a rod spacing ds from the antenna axis, uniformly distributed around the antenna axis 12. The rod spacing ds is the same for all antenna rods.

In the case of the whole-body coil 6, the rod spacing ds is minimally larger than half of the diameter D of the examination space 1. The rod spacing ds typically ranges between 25 and 35 cm. Give fashioning of the radio-frequency antenna as a local coil 7, the rod spacing ds can naturally be smaller than 25 cm.

The antenna rods 10 are connected to the respective rings 11 at their rod ends E (see FIGS. 8 and 9). The rings 11 are thus arranged concentric to the antenna axis 12.

The rings 11 each exhibit ring spacing dr from the antenna axis 12 that are smaller than the rod spacing ds. According to FIG. 3, the ring spacing dr of each ring 11 is smaller than the rod spacing ds. In principle, however, it would be sufficient for only the ring spacing dr for only one ring 11 to be smaller than the rod spacing ds. The ring spacing dr preferably is at least 5 mm (more preferably 10 to 15 mm) smaller than the rod spacing ds.

Figure 3:
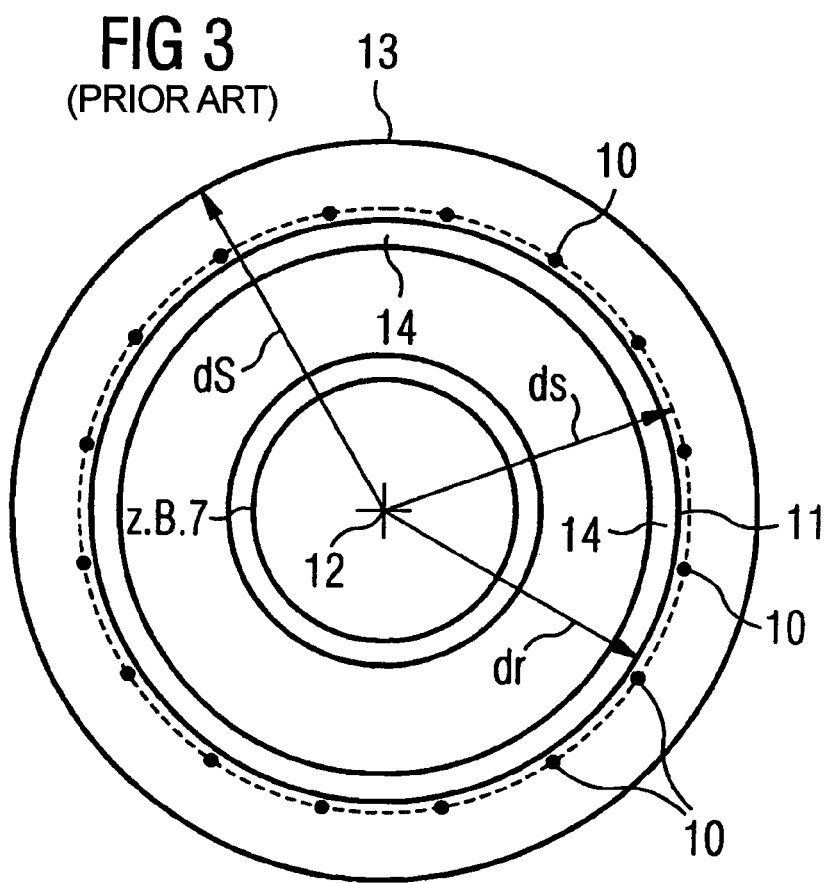
FIG. 3 shows the radio-frequency antenna of FIG. 2 in a plan view.

As can be seen from FIG. 3, the antenna rods 10 and the rings 11 are radially, externally surrounded by a radio-frequency shielding 13. The radio-frequency shielding 13 proceeds concentrically around the antenna axis at a shielding spacing dS. The radio-frequency shielding 13 thus always exhibits the same shielding spacing dS from the antenna axis 12 in the region of the antenna rods 10. The difference of the shielding spacing dS and the rod spacing ds is typically between 25 and 35 mm, for example 30 mm. The difference of the ring spacing dr and the rod spacing ds should be at least 15% (preferably 20 to 40%) of the difference between the shielding spacing dS and the rod spacing ds. Given a spacing of the radio-frequency shielding 13 from the antenna rods 10 of 25/30/35 mm, the radial spacing of the rings 11 from the antenna rods 10 is thus at least 2.75/4.50/5.25 mm (preferably 5/6/7 to 10/12/14).

Figure 4:
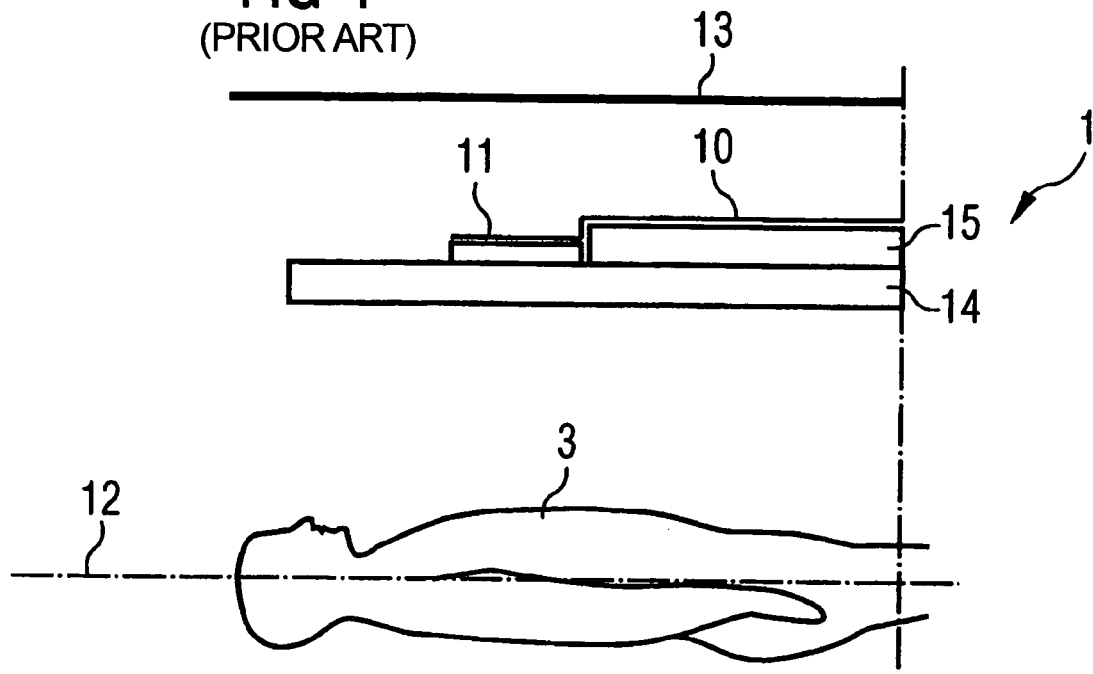
FIG. 4 shows the radio-frequency antenna of FIG. 2 from the side.

As can be seen particularly clearly from FIGS. 3 and 4, the antenna rods 10 and the rings 11 are externally mounted on a carrier tube 14 (here cylindrical). In the case of the whole-body coil 6, the carrier tube 14 corresponds to the inner wall of the examination space 1. The increased spacing of the antenna rods 10 from the rod axis 12 can be ensured by a separate spacer 15 placed on the carrier tube 14. The spacer 15 preferably is formed of a thermally insulating material, for example polyurethane foam.

According to FIG. 5, the radio-frequency antenna 6, 7 has exactly two detuning circuits 16 that are connected to supply cables 17 for the radio-frequency antenna 6 or 7. The detuning circuits 16, for example, are fashioned as capacitor networks that can be switched on via diode switches on the supply cables 17. By switching on the detuning circuits 16 on the supply cables 17, a detuning of the radio-frequency antenna 6 or 7 is thus possible.

Figure 6:
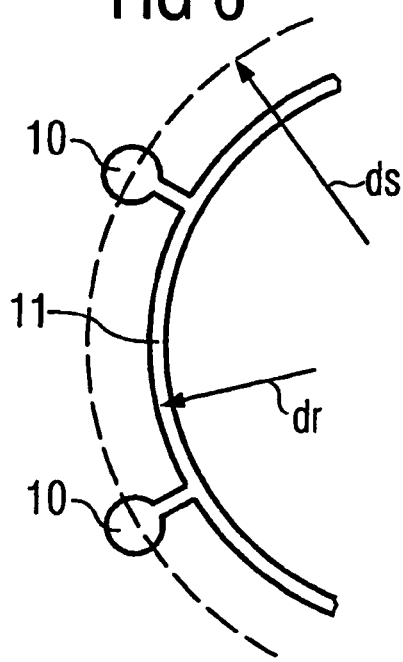
FIG. 6 illustrates a first embodiment of a connection between a ring and the antenna rods in a radio-frequency antenna in accordance with the invention.
Figure 7:
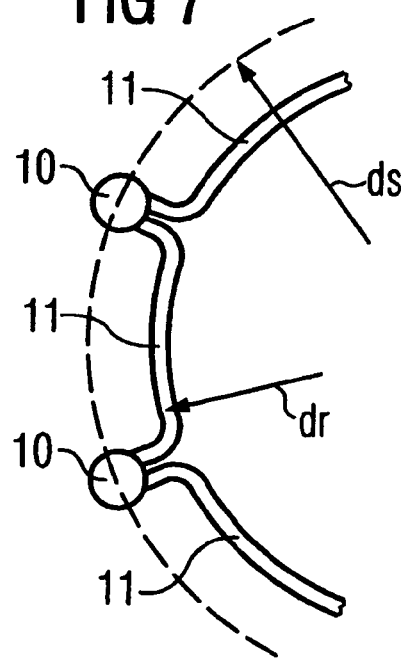
FIG. 7 illustrates a second embodiment of a connection between a ring and the antenna rods in a radio-frequency antenna in accordance with the invention.

According to FIG. 6, the connection of the antenna rods 10 with the rings 11 is effected by the antenna rods 10 being directed radially inwardly toward their rod ends E. Alternatively, however, it is possible according to FIG. 7 for the connection of the antenna rods 10 with the rings 11 to be effected by the rings 11 projecting radially outwardly at their connection regions to the antenna rods 10.

When the antenna rods are directed inwardly toward their rod ends E, this can be realized in two manners that can be used alternatively. As shown in FIG. 8 the antenna rods 10 in the region of the rod ends E are bent radially inwardly. In this case, the bending ensues, with regard to the total length of the antenna rods 10, in the last 10%, in particular in the last 5%, before the rod end E. According to FIG. 9, however, it is also possible for the antenna rods 10 to gradually proceed radially inwardly from the middle region M to the rod ends E. The gradual, radially inward course extends in this case over at least 20% (preferably 30 to 35%) of the total length of the antenna rods 10. In this case, preferably no further radial spacing change ensues in the outermost 10% of the antenna rod 10.

In each of the embodiment described above (compare in particular the representations in FIGS. 2, 8 and 9) each antenna rod 10 proceeds substantially parallel to the antenna axis 12. In its middle region M, it exhibits the rod spacing ds from the antenna axis 12. This rod spacing ds is longer than the ring spacing dr from the antenna axis 12 that the rings 11 exhibit.

As shown in FIGS. 2 and 3, and as assumed in connection with FIGS. 8 and 9, the antenna rods 10 normally are arranged circularly around the antenna axis 12. The rings 11 and the radio-frequency shielding 13 also are normally arranged symmetrically relative to the antenna axis 12. As shown in FIG. 10, however, it is also possible for one of the rings 11 (or both rings 11) and/or the radio-frequency shielding 13 to be arranged asymmetrically with regard to the antenna axis 12. A possible asymmetric arrangement of the radio-frequency shielding 13 can be realized independent of an asymmetric arrangement of one of the rings 11 or, respectively, of both rings 11.

According to FIG. 11, it is furthermore possible to fashion the radio-frequency antenna not in the shape of a cylinder, but rather in the shape of a frustrum. In this case, the antenna rods 10, together with the antenna axis 12, form an inclination angle α. Corresponding to this, each antenna rod 10 has a rod end E that is situated farther from the antenna axis 12 than the other rod end E. The rod spacing ds is in this case the spacing from the antenna axis 12 of this rod end E (thus of the rod end E situated farther from the antenna axis 12). This rod spacing ds is in this case greater than the ring spacing dr from the antenna axis 12 of the ring 11 that is connected with this rod end E.

Figure 12:
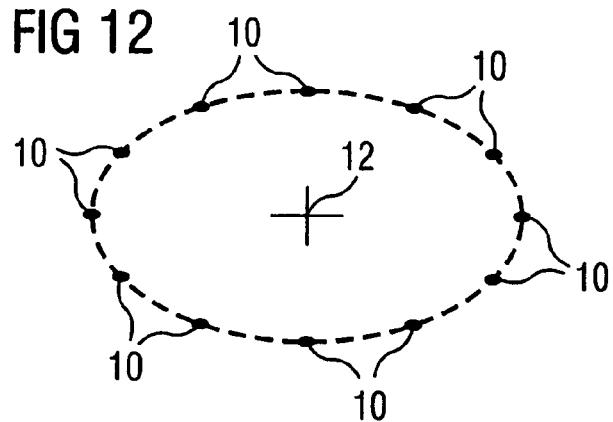
FIG. 12 is a plan view of an elliptically shaped embodiment of a radio-frequency antenna in accordance with the invention.

As shown in FIG. 12, the arrangement of the antenna rods 10 also is not necessarily circular. Rather, it is sufficient for the antenna rods 10 to be regularly arranged around the antenna axis 12. For example, the antenna rods 10, as shown FIG. 12, can be arranged elliptically around the antenna axis 12. Local fields can thereby be generated, for example in the shoulder region of the patient 3, that are smaller in extent than in the breast or back region of the patient 3. The occupancy ratio of the antenna can be increased without increasing the stress on the patient 3.

Figure 13:
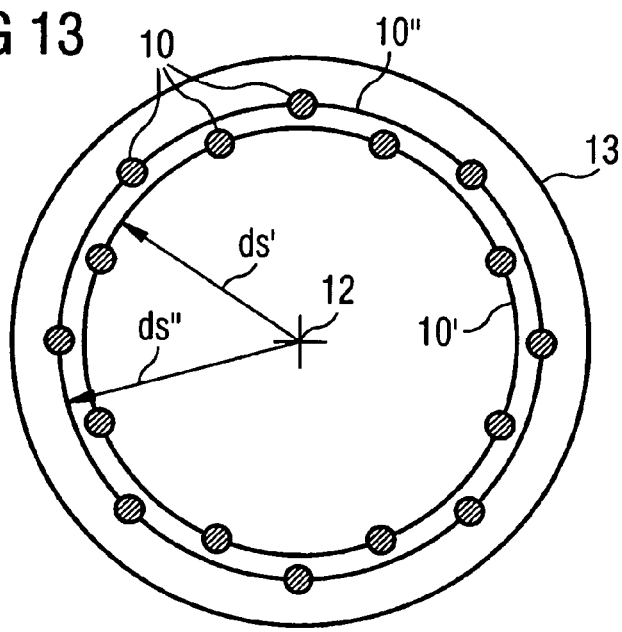
FIG. 13 is a plan view of a further embodiment for arranging the antenna rods relative to the antenna axis in accordance with the invention.

It is also possible, as shown in FIG. 13, for the antenna rods 10 to form two substructures rotated oppositely to one another with regard to the antenna axis 12. In this case, each of the substructures 10', 10" is regularly arranged around the antenna axis 12. The substructures 10', 10" in this case exhibit rod spacings ds', ds" that are different from one another. They preferably are arranged on gaps relative to one another.

Figure 14:
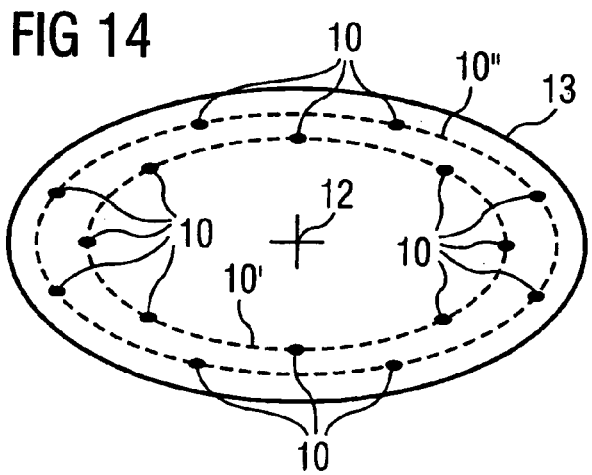
FIG. 14 is a further elliptically shaped embodiment of a radio-frequency antenna in accordance with the invention.

In the embodiment of FIG. 13, the substructures 10', 10" are arranged circularly around the antenna axis 12, however, here as well a regular arrangement is sufficient. In particular, an elliptical arrangement (see FIG. 14) is again possible.

The goals according to the object can be achieved in a simple manner by the inventive radio-frequency antenna, without impairment of the homogeneity of the generated radio-frequency field.

Although modifications and changes may be suggested by those skilled in the art, it is the intention of the inventor to embody within the patent warranted hereon all changes and modifications as reasonably and properly come within the scope of his contribution to the art.

I claim:

1. A radio-frequency antenna for a magnetic resonance system comprising:
   a plurality of antenna rods, each antenna rod having opposite ends;
   two rings;
   said antenna rods being regularly disposed around a longitudinal antenna axis with the respective opposite ends of each of said antenna rods being connected to said rings, each of said antenna rods having a middle region between said rings and proceeding substantially parallel to said antenna axis; and
   each of said antenna rods being bent radially inwardly toward said antenna axis only in an outermost 10% of said longitudinal length at each of said opposite ends for causing each of said antenna rods to have a rod spacing from said antenna axis that is larger than a ring spacing of at least one of said rings from said antenna axis.

2. A radio-frequency antenna as claimed in claim 1 wherein a difference between said ring spacing and said rod spacing is at least 5 mm.

3. A radio-frequency antenna as claimed in claim 2 wherein said difference is in a range between 10 and 15 mm.

4. A radio-frequency antenna as claimed in claim 1 comprising radio-frequency shielding radially externally surrounding said antenna rods and said rings.

5. A radio-frequency antenna as claimed in claim 4 wherein said radio-frequency shielding is disposed at a shielding spacing from said antenna axis, and wherein a difference between said ring spacing and said rod spacing is at least 15% of a difference between said shielding spacing and said rod spacing.

6. A radio-frequency antenna as claimed in claim 5 wherein said difference is in a range between 20 and 40%.

7. A radio-frequency antenna as claimed in claim 4 wherein said radio frequency shielding is symmetrically disposed relative to said antenna axis.

8. A radio-frequency antenna as claimed in claim 4 wherein said radio frequency shielding is asymmetrically disposed relative to said antenna axis.

9. A radio-frequency antenna as claimed in claim 1 comprising exactly two detuning circuits electrically connected to at least one of said rings.

10. A radio-frequency antenna as claimed in claim 9 comprising supply cables connected to said at least one of said rings, and wherein said two detuning circuits are connected to said supply cables.

11. A radio-frequency antenna as claimed in claim 1 comprising a carrier tube having an exterior to which said antenna rods are mounted.

12. A radio-frequency antenna as claimed in claim 1 wherein said rod spacing is between 25 and 35 cm.

13. A radio-frequency antenna as claimed in claim 1 wherein said antenna rods comprise two groups of antenna rods, one of said groups being circumferentially rotated relative to the other around said antenna axis, the antenna rods in each of said groups being regularly disposed around said antenna axis, and the antenna rods in one of said groups having a rod spacing that is different from the rod spacing of the antenna rods in another of said groups.

14. A radio-frequency antenna as claimed in claim 1 wherein said antenna rods are circularly disposed around said antenna axis.

15. A radio-frequency antenna as claimed in claim 1 wherein said antenna rods are elliptically disposed around said antenna axis.

16. A radio-frequency antenna as claimed in claim 1 wherein said rings are symmetrically disposed relative to said antenna axis.

17. A radio-frequency antenna as claimed in claim 1 wherein said rings are asymmetrically disposed relative to said antenna axis.

18. A radio-frequency antenna for a magnetic resonance system comprising:
   a plurality of antenna rods, each antenna rod having opposite ends;
   two rings;
   said antenna rods being regularly disposed around a longitudinal antenna axis with the respective opposite ends of each of said antenna rods being connected to said rings, each of said antenna rods having a middle region between said rings and proceeding substantially parallel to said antenna axis; and
   each of said antenna rods proceeding radially inwardly toward said antenna axis from said middle region over at least 20% of said longitudinal length, and exhibiting no radially inward change in an outermost 10% of said longitudinal length at each of said opposite ends, for causing said antenna rods to have a rod spacing from said antenna axis that is larger than a ring spacing from said antenna axis for at least one of said rings.

19. A radio-frequency antenna as claimed in claim 18 wherein a difference between said ring spacing and said rod spacing is at least 5 mm.

20. A radio-frequency antenna as claimed in claim 19 wherein said difference is in a range between 10 and 15 mm.

21. A radio-frequency antenna as claimed in claim 18 comprising radio-frequency shielding radially externally surrounding said antenna rods and said rings.

22. A radio-frequency antenna as claimed in claim 21 wherein said radio-frequency shielding is disposed at a shielding spacing from said antenna axis, and wherein a difference between said ring spacing and said rod spacing is at least 15% of a difference between said shielding spacing and said rod spacing.

23. A radio-frequency antenna as claimed in claim 22 wherein said difference is in a range between 20 and 40%.

24. A radio-frequency antenna as claimed in claim 21 wherein said radio-frequency shielding is symmetrically disposed relative to said antenna axis.

25. A radio-frequency antenna as claimed in claim 21 wherein said radio-frequency shielding is asymmetrically disposed relative to said antenna axis.

26. A radio-frequency antenna as claimed in claim 18 comprising exactly two detuning circuits electrically connected to at least one of said rings.

27. A radio-frequency antenna as claimed in claim 26 comprising supply cables connected to said at least one of said rings, and wherein said two detuning circuits are connected to said supply cables.

28. A radio-frequency antenna as claimed in claim 18 comprising a carrier tube having an exterior to which said antenna rods are mounted.

29. A radio-frequency antenna as claimed in claim 18 wherein said rod spacing is between 25 and 35 cm.

30. A radio-frequency antenna as claimed in claim 18 wherein said antenna rods comprise two groups of antenna rods, one of said groups being circumferentially rotated relative to the other around said antenna axis, the antenna rods in each of said groups being regularly disposed around said antenna axis, and the antenna rods in one of said groups having a rod spacing that is different from the rod spacing of the antenna rods in another of said groups.

31. A radio-frequency antenna as claimed in claim 18 wherein said antenna rods are circularly disposed around said antenna axis.

32. A radio-frequency antenna as claimed in claim 18 wherein said antenna rods are elliptically disposed around said antenna axis.

33. A radio-frequency antenna as claimed in claim 18 wherein said rings are symmetrically disposed relative to said antenna axis.

34. A radio-frequency antenna as claimed in claim 18 wherein said rings are asymmetrically disposed relative to said antenna axis.

35. A radio-frequency antenna for a magnetic resonance system comprising:
a plurality of antenna rods, each antenna rod having opposite ends;
two rings;
said antenna rods being regularly disposed around a longitudinal antenna axis with the respective opposite ends of each of said antenna rods being connected to said rings, each of said antenna rods having a middle region between said rings and proceeding substantially parallel to said antenna axis; and
each of said rings having a plurality of radially outwardly projecting connection regions at which said rings are respectively connected to the opposite ends of the antenna rods, for causing each of said antenna rods to have a rod spacing from said antenna axis that is larger than a ring spacing from the antenna axis for each of said rings.

36. A radio-frequency antenna as claimed in claim 35 wherein a difference between said ring spacing and said rod spacing is at least 5 mm.

37. A radio-frequency antenna as claimed in claim 36 wherein said difference is in a range between 10 and 15 mm.

38. A radio-frequency antenna as claimed in claim 35 comprising radio-frequency shielding radially externally surrounding said antenna rods and said rings.

39. A radio-frequency antenna as claimed in claim 38 wherein said radio-frequency shielding is disposed at a shielding spacing from said antenna axis, and wherein a difference between said ring spacing and said rod spacing is at least 15% of a difference between said shielding spacing and said rod spacing.

40. A radio-frequency antenna as claimed in claim 39 wherein said difference is in a range between 20 and 40%.

41. A radio-frequency antenna as claimed in claim 38 wherein said radio-frequency shielding is symmetrically disposed relative to said antenna axis.

42. A radio-frequency antenna as claimed in claim 38 wherein said radio-frequency shielding is asymmetrically disposed relative to said antenna axis.

43. A radio-frequency antenna as claimed in claim 35 comprising exactly two detuning circuits electrically connected to at least one of said rings.

44. A radio-frequency antenna as claimed in claim 43 comprising supply cables connected to said at least one of said rings, and wherein said two detuning circuits are connected to said supply cables.

45. A radio-frequency antenna as claimed in claim 35 comprising a carrier tube having an exterior to which said antenna rods are mounted.

46. A radio-frequency antenna as claimed in claim 35 wherein said rod spacing is between 25 and 35 cm.

47. A radio-frequency antenna as claimed in claim 35 wherein said antenna rods comprise two groups of antenna rods, one of said groups being circumferentially rotated relative to the other around said antenna axis, the antenna rods in each of said groups being regularly disposed around said antenna axis, and the antenna rods in one of said groups having a rod spacing that is different from the rod spacing of the antenna rods in another of said groups.

48. A radio-frequency antenna as claimed in claim 35 wherein said antenna rods are circularly disposed around said antenna axis.

49. A radio-frequency antenna as claimed in claim 35 wherein said antenna rods are elliptically disposed around said antenna axis.

50. A radio-frequency antenna as claimed in claim 35 wherein said rings are symmetrically disposed relative to said antenna axis.

51. A radio-frequency antenna as claimed in claim 35 wherein said rings are asymmetrically disposed relative to said antenna axis.

52. A radio-frequency antenna for a magnetic resonance system comprising:
a plurality of antenna rods;
two rings;
said antenna rods being regularly disposed around a longitudinal antenna axis and having opposite ends respectively connected to said rings, with each of said antenna rods forming an inclination angle relative to said antenna axis, causing a combination of said antenna rods and said rings to have a conical frustrum shape, with each of said antenna rods having one of said opposite ends disposed farther from said antenna axis than the other of said opposite ends, and each antenna rod having a rod spacing from said antenna axis measured at said one of said opposite ends that is farther from said antenna axis; and said rod spacing being larger than a ring spacing of the antenna ring connected to the respective ends of the antenna rods that are disposed farther from said antenna axis.

53. A radio-frequency antenna as claimed in claim 52 wherein a difference between said ring spacing and said rod spacing is at least 5 mm.

54. A radio-frequency antenna as claimed in claim 53 wherein said difference is in a range between 10 and 15 mm.

55. A radio-frequency antenna as claimed in claim 52 comprising radio-frequency shielding radially externally surrounding said antenna rods and said rings.

56. A radio-frequency antenna as claimed in claim 55 wherein said radio-frequency shielding is disposed at a shielding spacing from said antenna axis, and wherein a difference between said ring spacing and said rod spacing is at least 15% of a difference between said shielding spacing and said rod spacing.

57. A radio-frequency antenna as claimed in claim 56 wherein said difference is in a range between 20 and 40%.

58. A radio-frequency antenna as claimed in claim 55 wherein said radio-frequency shielding is symmetrically disposed relative to said antenna axis.

59. A radio-frequency antenna as claimed in claim 55 wherein said radio-frequency shielding is asymmetrically disposed relative to said antenna axis.

60. A radio-frequency antenna as claimed in claim 52 comprising exactly two detuning circuits electrically connected to at least one of said rings.

61. A radio-frequency antenna as claimed in claim 60 comprising supply cables connected to said at least one of said rings, and wherein said two detuning circuits are connected to said supply cables.

62. A radio-frequency antenna as claimed in claim 52 comprising a carrier tube having an exterior to which said antenna rods are mounted.

63. A radio-frequency antenna as claimed in claim 52 wherein said rod spacing is between 25 and 35 cm.

64. A radio-frequency antenna as claimed in claim 52 wherein said antenna rods comprise two groups of antenna rods, one of said groups being circumferentially rotated relative to the other around said antenna axis, the antenna rods in each of said groups being regularly disposed around said antenna axis, and the antenna rods in one of said groups having a rod spacing that is different from the rod spacing of the antenna rods in another of said groups.

65. A radio-frequency antenna as claimed in claim 52 wherein said antenna rods are circularly disposed around said antenna axis.

66. A radio-frequency antenna as claimed in claim 52 wherein said antenna rods are elliptically disposed around said antenna axis.

67. A radio-frequency antenna as claimed in claim 52 wherein said rings are symmetrically disposed relative to said antenna axis.

68. A radio-frequency antenna as claimed in claim 52 wherein said rings are asymmetrically disposed relative to said antenna axis.

69. A radio-frequency antenna as claimed in claim 52 wherein, for each of said antenna rods, said one of said opposite ends that is disposed farther from said antenna axis projects radially inwardly substantially in a plane containing said one of said rings to which said of said opposites ends of said antenna rod is connected.

70. A radio-frequency antenna as claimed in claim 52 wherein said one of said rings, to which the respective opposite ends of the antenna rods are connected that are disposed farther from said antenna axis, has a plurality of radially outwardly projecting connections to the respective antenna rods.

* * * * *